(12) United States Patent
Takeuchi et al.

(10) Patent No.: US 8,575,648 B2
(45) Date of Patent: Nov. 5, 2013

(54) SILICON CARBIDE SEMICONDUCTOR DEVICE AND METHOD OF MANUFACTURING THE SAME

(75) Inventors: Yuuichi Takeuchi, Obu (JP); Rajesh Kumar Malhan, Nagoya (JP); Naohiro Sugiyama, Nagoya (JP)

(73) Assignee: DENSO CORPORATION, Kariya (JP)

( * ) Notice: Subject to any disclaimer, the term of this patent is extended or adjusted under 35 U.S.C. 154(b) by 225 days.

(21) Appl. No.: 12/976,116

(22) Filed: Dec. 22, 2010

(65) Prior Publication Data

US 2011/0156054 A1 Jun. 30, 2011

(30) Foreign Application Priority Data

Dec. 25, 2009 (JP) ................................. 2009-294799

(51) Int. Cl.
*H01L 29/423* (2006.01)
*H01L 21/337* (2006.01)

(52) U.S. Cl.
USPC ........... 257/134; 257/135; 257/330; 438/186; 438/192

(58) Field of Classification Search
USPC ......... 438/186, 192, 197, 259, 269, 270, 134, 438/135, 216, 329, 330, 332, E29.066, 438/E29.201; 257/134, 135, 216, 329, 330, 257/332, E29.066, E29.201
See application file for complete search history.

(56) References Cited

U.S. PATENT DOCUMENTS

| | | | |
|---|---|---|---|
| 7,241,694 B2 * | 7/2007 | Takeuchi et al. | 438/700 |
| 7,582,932 B2 * | 9/2009 | Kumar et al. | 257/332 |
| 7,821,013 B2 * | 10/2010 | Kumar et al. | 257/77 |
| 8,193,564 B2 * | 6/2012 | Suzuki et al. | 257/216 |
| 2005/0233539 A1 | 10/2005 | Takeuchi et al. | |

FOREIGN PATENT DOCUMENTS

| | | |
|---|---|---|
| JP | A-2003-69038 | 3/2003 |
| JP | A-2003-069041 | 3/2003 |
| JP | A-2004-311695 | 11/2004 |

OTHER PUBLICATIONS

Office Action mailed Jan. 10, 2012 in corresponding JP Application No. 2009-294799 (and English translation).

* cited by examiner

*Primary Examiner* — Hsien Ming Lee
(74) *Attorney, Agent, or Firm* — Posz Law Group, PLC (57) ABSTRACT

A silicon carbide semiconductor device having a JFET or a MOSFET includes a semiconductor substrate and a trench. The semiconductor substrate has a silicon carbide substrate, a drift layer on the silicon carbide substrate, a first gate region on the drift layer, and a source region on the first gate region. The trench has a strip shape with a longitudinal direction and reaches the drift layer by penetrating the source region and the first gate region. The trench is filled with a channel layer and a second gate region on the channel layer. The source region is not located at an end portion of the trench in the longitudinal direction.

14 Claims, 12 Drawing Sheets

SILICON CARBIDE SEMICONDUCTOR DEVICE AND METHOD OF MANUFACTURING THE SAME

CROSS REFERENCE TO RELATED APPLICATION

This application is based on and incorporates herein by reference Japanese Patent Application No. 2009-294799 filed on Dec. 25, 2009.

FIELD OF THE INVENTION

The present invention relates to a silicon carbide (SiC) semiconductor device having a junction field-effect transistor (JFET) or a metal-oxide semiconductor field-effect transistor (MOSFET) with a trench structure and also relates to a method of manufacturing the SiC semiconductor device.

BACKGROUND OF THE INVENTION

Figure 7A:
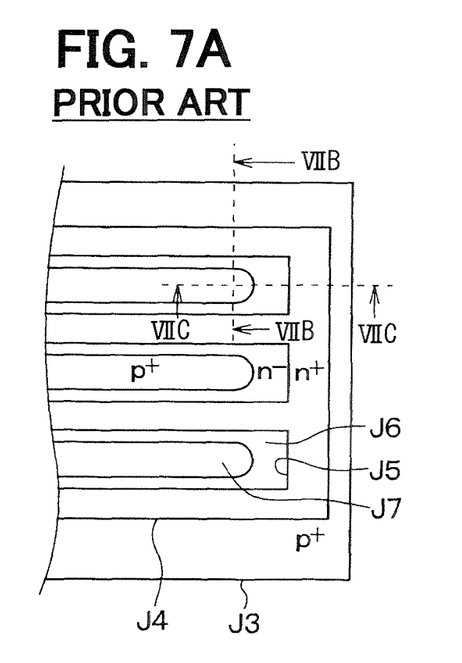
FIG. 7A is a diagram illustrating a plan view of a conventional SiC semiconductor device.
Figure 7B:
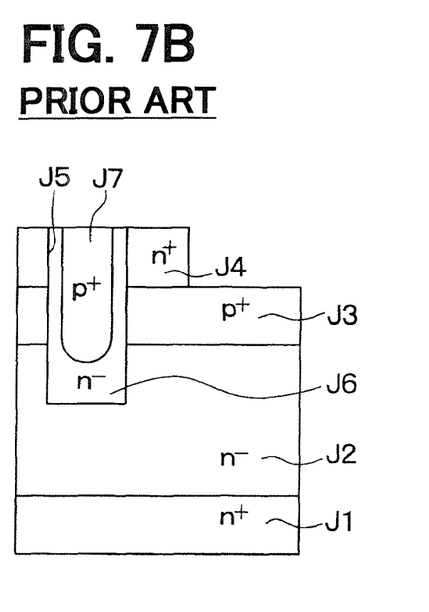
FIG. 7B is a diagram illustrating a cross-sectional view taken along the line VIIB-VIIB in FIG. 7A.
Figure 7C:
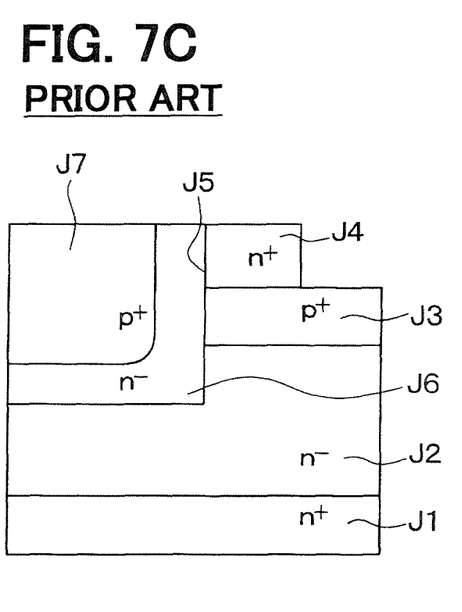
FIG. 7C is a diagram illustrating a cross-sectional view taken along the line VIIC-VIIC in FIG. 7A.

A SiC semiconductor device having a JFET with a trench structure has been disclosed, for example, in JP 2003-69041 A or US 2005/0233539 corresponding to JP 2005-328014 A. FIGS. 7A-7C illustrates such a conventional SiC semiconductor device. FIG. 7A is a plan view of the conventional SiC semiconductor device, FIG. 7B is a cross-sectional view taken along the line VIIB-VIIB in FIG. 7A, and FIG. 7C is a cross-sectional view taken along the line VIIC-VIIC in FIG. 7A.

As shown in FIGS. 7A-7C, after a $n^-$-type drift layer J2, a $p^+$-type first gate region J3, a $n^+$-type source region J4 are formed, in turn, on a $n^+$-type SiC substrate J1, a trench J5 penetrating these is formed. Then, an $n^-$-type channel layer J6 and a $p^+$-type second gate region J7 are formed in the trench J5. Although not shown in the drawings, a gate voltage applied to a gate electrode electrically connected to the second gate region J7 is controlled so that a drain current can flow between a source electrode electrically connected to the $n^+$-type source region J4 and a drain electrode electrically connected to the $n^+$-type SIC substrate J1.

Figure 8:
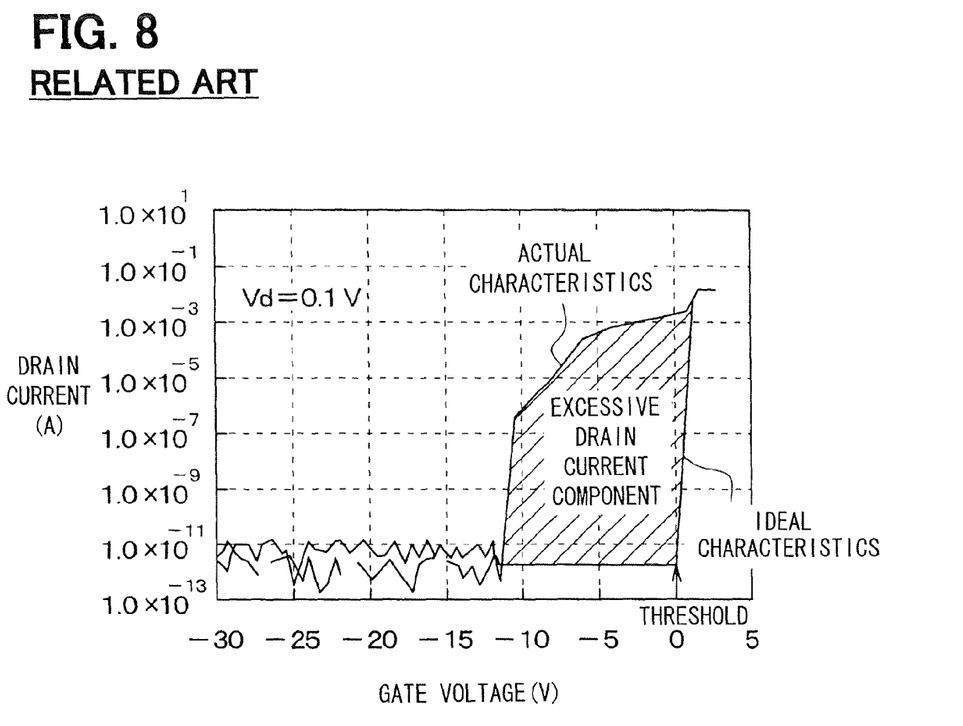
FIG. 8 is a diagram illustrating a result of a measurement of a characteristic of a drain current with respect to a gate voltage for the conventional SiC semiconductor device.

In the above-described conventional SiC semiconductor device, as shown in FIG. 7A, each trench J5 has a strip shape, and the trenches J5 are laid out in a stripe pattern. However, it has been confirmed that when the trenches J5 has a strip shape, an excessive drain current flows. FIG. 8 is a characteristic diagram obtained when a drain current characteristic with respect to a gate voltage of the SiC semiconductor device is measured. As can be understood from FIG. 8, when the gate voltage approaches a threshold for driving the JFET, the drain current starts to flow before the gate voltage exceeds the threshold. Due to the drain current occurring near the threshold, an ideal JFET characteristic, in which the drain current does not start to flow until the gate voltage reaches the threshold, cannot be obtained.

It has been confirmed that such a problem can occur not only in a JFET, but also in an accumulation mode MOSFET.

SUMMARY OF THE INVENTION

In view of the above, it is an object of the present invention to provide a SiC semiconductor device having a JFET or a MOSFET with a trench structure for reducing an excessive drain current occurring when a gate voltage approaches a threshold. It is another object of the present invention to provide a method of manufacturing the SiC semiconductor device.

According to a first aspect of the present invention, a silicon carbide semiconductor device having a JFET includes a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation. The silicon carbide semiconductor device further includes a trench, a first conductivity type channel layer, and a second conductivity type second gate region. The trench has a strip shape with a longitudinal direction and reaches the drift layer by penetrating the source region and the first gate region. The channel layer is formed on an inner wall of the trench by epitaxial growth. The second gate region is formed on the channel layer. The source region is not formed at an end portion of the trench in the longitudinal direction. The source region can be formed at a long side portion of the trench.

According to a second aspect of the present invention, a silicon carbide semiconductor device having a MOSFET includes a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation. The silicon carbide semiconductor device further includes a trench, a first conductivity type channel layer, a gate insulation layer, and a gate electrode. The trench has a strip shape with a longitudinal direction and reaches the drift layer by penetrating the source region and the base layer. The channel layer is formed on an inner wall of the trench by epitaxial growth. The gate insulation layer is formed on the channel layer. The gate electrode is formed on a surface of the gate insulation layer in the trench. The source region is not formed at an end portion of the trench in the longitudinal direction. The source region can be formed at a long side portion of the trench.

According to a third aspect of the present invention, a method of manufacturing a silicon carbide semiconductor device having a JFET includes preparing a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation. The method further includes forming a strip-shaped trench having a longitudinal direction and reaching the drift layer by penetrating the source region and the gate region, forming a first conductivity type channel layer on an inner wall of the trench by epitaxial growth, forming a second conductivity type second gate region on the channel layer, planarizing the channel layer and the second gate region until the source region is exposed, and removing the source region, the channel layer, and the second gate region at least at an end portion of the trench in the longitudinal direction by performing selective etching after the planarizing so that the end portion of the trench has a recess shape with a depth greater than a thickness of the source region. Instead of the removing step, the method can include forming a second conductivity region having a depth greater than a thickness of the source region at an end portion of the trench in the longitudinal direction after the planarizing in such a manner that the source region located at least at the end portion of the trench is covered with the second conductivity region.

According to a fourth aspect of the present invention, a method of manufacturing a silicon carbide semiconductor device having a MOSFET includes preparing a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation. The method further includes forming a strip-shaped trench having a longitudinal direction and reaching the drift layer by penetrating the source region and the base layer, forming a first conductivity type channel layer on an inner wall of the trench by epitaxial growth, forming a gate insulation layer on the channel layer, forming a gate electrode on a surface of the gate insulation layer in the trench, planarizing the gate electrode, the gate insulation layer, and the channel layer until the source region is exposed, removing the source region, the channel layer, and the second gate region at least at an end portion of the trench in the longitudinal direction by performing selective etching after the planarizing so that the end portion of the trench has a recess shape with a depth greater than a thickness of the source region. Instead of the removing step, the method can include forming a second conductivity region having a depth greater than a thickness of the source region at an end portion of the trench in the longitudinal direction after the planarizing in such a manner that the source region located at least at the end portion of the trench is covered with the second conductivity region.

According to a fifth aspect of the present invention, a method of manufacturing a silicon carbide semiconductor device having a JFET includes preparing a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation. The method further includes forming a strip-shaped trench having a longitudinal direction and reaching the drift layer by penetrating the source region and the gate region, forming a first conductivity type channel layer on an inner wall of the trench by epitaxial growth, and forming a second conductivity type second gate region on the channel layer. The preparing step includes forming the source region on the first gate region by ion implantation in such a manner that the source region is formed at a long side portion of the trench and is not formed at an end portion of the trench in the longitudinal direction.

According to a sixth aspect of the present invention, a method of manufacturing a silicon carbide semiconductor device having a MOSFET includes preparing a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation. The method further includes forming a strip-shaped trench having a longitudinal direction and reaching the drift layer by penetrating the source region and the base layer, forming a first conductivity type channel layer on an inner wall of the trench by epitaxial growth, forming a gate insulation layer on the channel layer, and forming a gate electrode on a surface of the gate insulation layer in the trench. The preparing step includes forming the source region on the base layer by ion implantation in such a manner that the source region is formed at a long side portion of the trench and is not formed at an end portion of the trench in the longitudinal direction.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

The present inventors have studied the above problem deeply and found out that a JFET formed at an end portion of the trench J5 causes the problem. That is, when the trench J5 has a strip shape, a JFET is basically constructed with a long side portion of the trench J5. In this case, since the n+-type source region J4 is formed by epitaxial growth, the n+-type source region J4 is formed over the entire substrate so that the JFET can be formed not only at the long side portion of the trench J5 but also at the end portion of the trench J5. A threshold of the JFET formed at the end portion of the trench J5 is different from a threshold of the JFET formed at the long side portion of the trench J5. The present inventors have concluded that the threshold difference can cause the above problem.

Figure 9A:
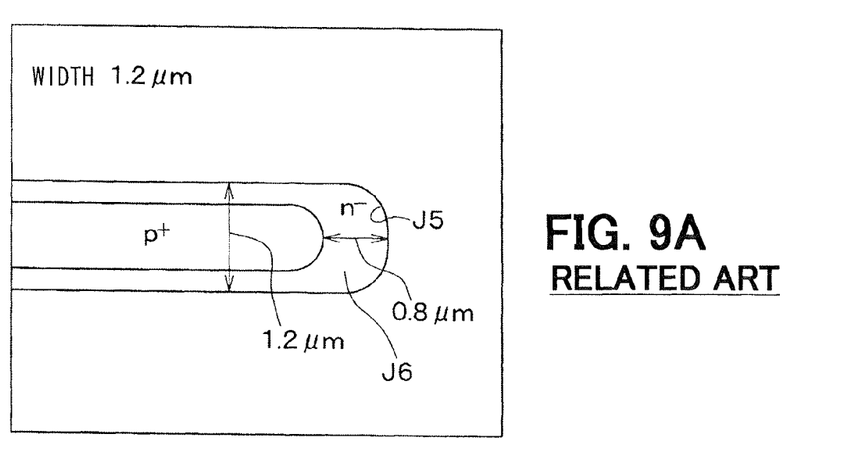
FIGS. 9A-9C are plan views of an end portion of a trench of the conventional SiC semiconductor device.
Figure 9B:
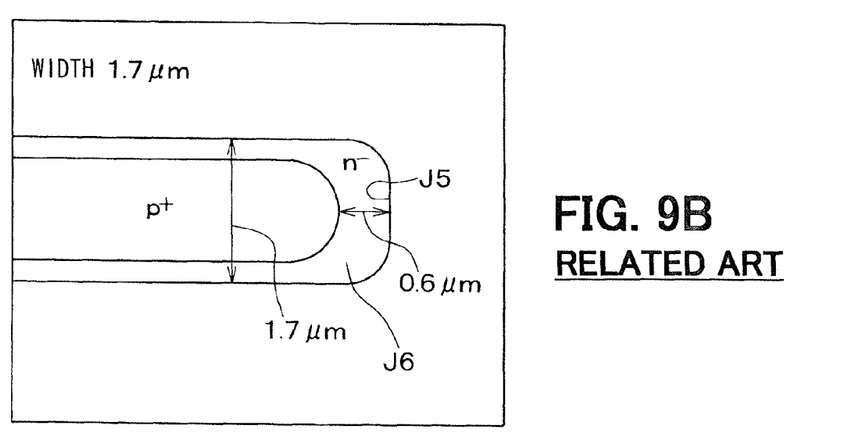
Figure 9C:
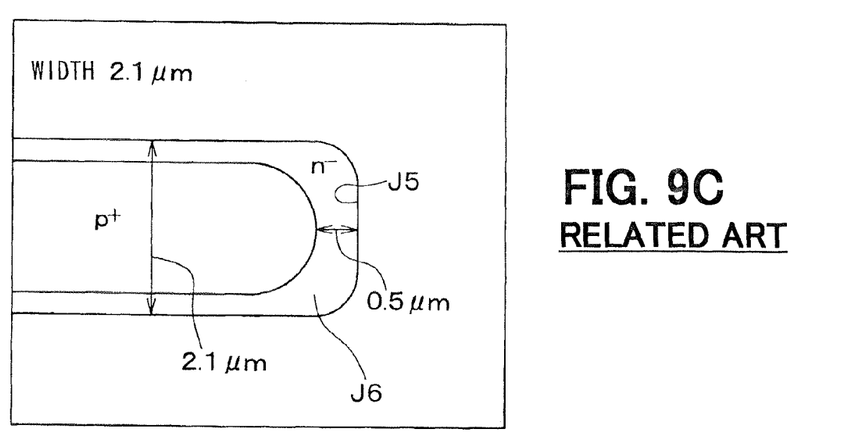
Figure 10:
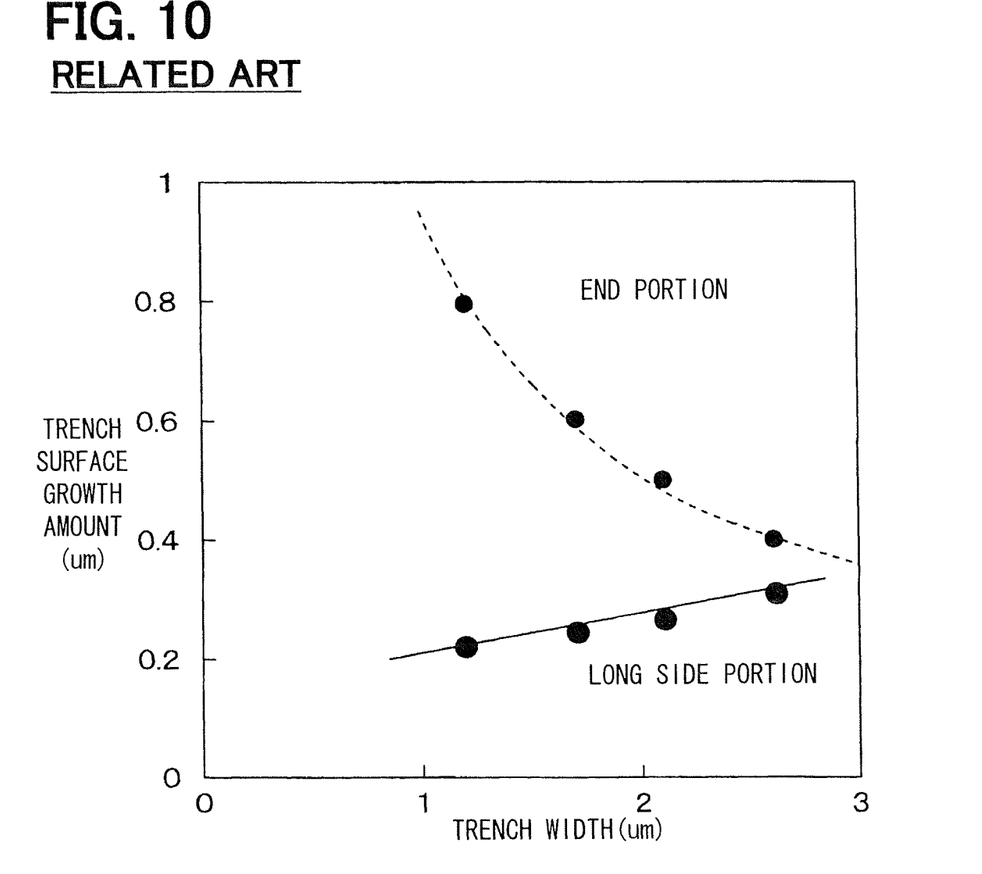
FIG. 10 is a diagram illustrating a measurement of a difference in the amount of growth between an n⁻-type channel layer formed at a long side portion of the trench and an n⁻-type channel layer formed at the end portion of the trench of the conventional SiC semiconductor device.

The present inventors have conducted an experiment to confirm the conclusion by changing the width of the trench J5. FIGS. 9A-9C are plan views of the end portion of the trench J5. As can be seen from FIGS. 9A-9C, when the width of the trench J5 is changed to 1.2 µm, 1.7 µm, and 2.1 µm, the thickness of the n−-type channel layer J6 grown at the end portion of the trench J5 becomes 0.8 µm, 0.6 µm, and 0.5 µm, respectively. Such a phenomenon occurs due to dependency of migration at the time of forming the n−-type channel layer J6 on the width of the trench J5. Specifically, due to capillary action, as the width of the trench J5 becomes smaller, migration to the end portion of the trench J5 becomes larger. As a reference, the present inventors have measured a difference in the amount of growth between the n−-type channel layer J6 formed at the long side portion of the trench J5 and the n−-type channel layer J6 formed at the end portion of the trench J5. FIG. 10 shows the result of the measurement. As shown in FIG. 10, the difference in the amount of growth decreases with an increase in the width of the trench J5 and increases with a decrease in the width of the trench J5.

Figure 11:
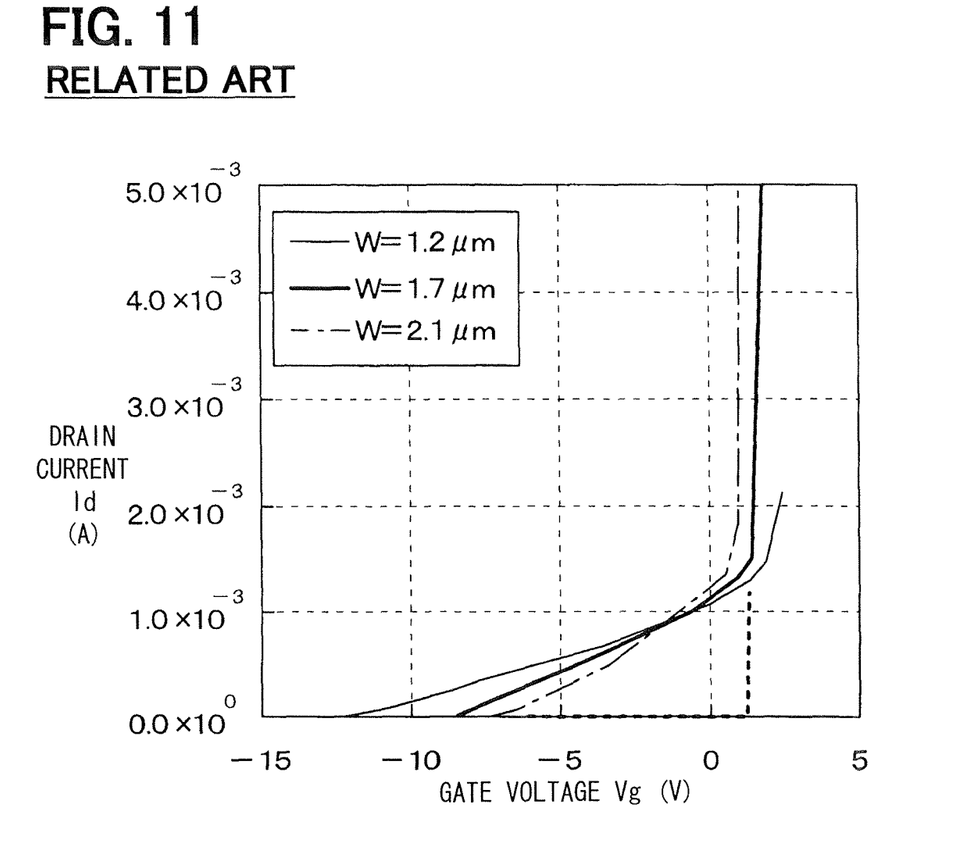
FIG. 11 is a diagram illustrating a result of a measurement of a characteristic of a drain current with respect to a gate voltage for each case of FIGS. 9A-9C.

Further, the present inventors have measured a characteristic of a drain current Id with respect to a gate voltage Vg for each case shown in FIGS. 9A-9C. FIG. 11 shows a result of the measurement. It is noted that "W" in FIG. 11 depicts the width of the trench J5.

A broken line in FIG. 11 represents an ideal characteristic in which the drain current Id does not flow until the gate voltage Vg reaches the threshold. In the case of the conventional SiC semiconductor device, a characteristic of the drain current Id with respect to the gate voltage Vg deviates from the ideal characteristic. The characteristic deviation varies depending on the thickness of the n−-type channel layer J6 formed at the end portion of the trench J5. Specifically, the characteristic deviation increases with the thickness of the n−-type channel layer J6. This is because the threshold decreases with the increase in the thickness of the n−-type channel layer J6. As the thickness of the n−-type channel layer J6 at the end portion of the trench J5 becomes larger with a decrease in the width of the trench J5, the characteristic deviation becomes larger due to the effect of the threshold of the JFET structure formed at the end portion of the trench J5. Therefore, the above problem can be solved by preventing the JFET structure from being formed at the end portion of the trench J5.

Embodiments of the present invention based on the above studies are described below with reference to the drawings. Throughout the embodiments, the same symbols are given to the same or corresponding parts in the drawings.

First Embodiment

Figure 1A:
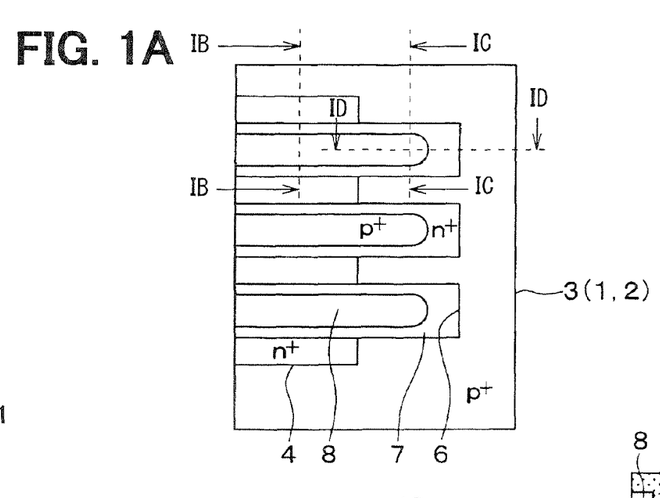
FIG. 1A is a diagram illustrating a plan view of a SIC semiconductor device according to a first embodiment of the present invention.
Figure 1B:
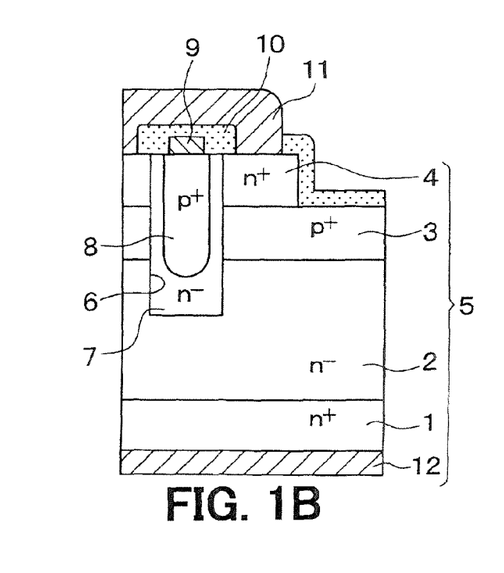
FIG. 1B is a diagram illustrating a cross-sectional view taken along the line IB-IB in FIG. 1A.
Figure 1C:
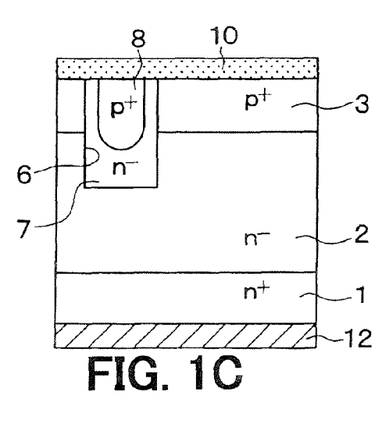
FIG. 1C is a diagram illustrating a cross-sectional view taken along the line IC-IC in FIG. 1A.
Figure 1D:
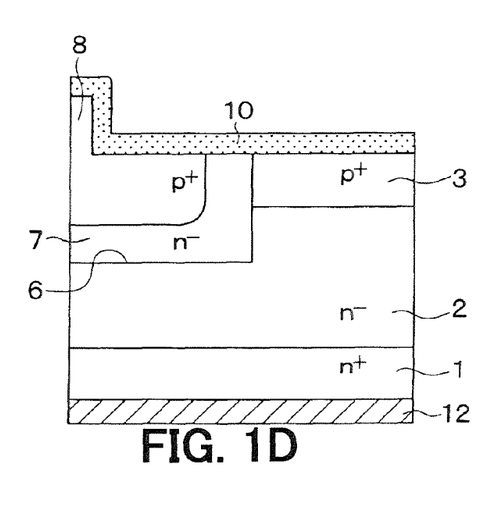
FIG. 1D is a diagram illustrating a cross-sectional view taken along the line ID-ID in FIG. 1A.

A SiC semiconductor device according to a first embodiment of the present invention is described below with reference to FIGS. 1A-1D. FIG. 1A is a plan view of the SIC semiconductor device, FIG. 1B is a cross-sectional view taken along the line IB-IB in FIG. 1A, FIG. 1C is a cross-sectional view taken along the line IC-IC in FIG. 1A, and FIG. 1D is a cross-sectional view taken along the line ID-ID in FIG. 1A.

The SIC semiconductor device illustrated in FIGS. 1A-1D is formed by using an n+-type SIC substrate 1. For example, an off-substrate can be used as the n+-type SiC substrate 1. Since a layout of a cell of a JFET formed in the n+-type SiC substrate 1 is independent of an off-direction, there is no need that the cell of the JFET is laid out according to the off-direction.

A basic structure of the JFET is described below with reference to FIG. 1B. As shown in FIG. 1B, a trench 6 is formed in a semiconductor substrate 5. The semiconductor substrate 5 includes an n+-type SIC substrate 1, an n−-type drift layer 2 on the n+-type SiC substrate 1, a p+-type first gate region 3 on the n−-type drift layer 2, and an n+-type source region 4 on the p+-type first gate region 3. An n−-type channel layer 7 is formed on an inner wall of the trench 6. The n−-type channel layer 7 extends to a surface of the semiconductor substrate 5. A p+-type second gate region 8 is formed on a surface of the n−-type channel layer 7 to completely fill the trench 6. A gate electrode 9 is formed on a surface of the second gate region 8, and a source electrode 11 is formed on the gate electrode 9 through an interlayer dielectric layer 10. The source electrode 11 is electrically connected to the n+-type source region 4 via a contact hole formed in the interlayer dielectric layer 10. Further, a drain electrode 12 is formed on a back surface of the n+-type SiC substrate 1 and electrically connected to the n+-type SiC substrate 1 serving as a drain region. The JFET has such a basic structure.

Further, as shown in FIG. 1A, an opening of the trench 6 has a strip shape with a longitudinal direction. Multiple trenches 6, each of which has such an opening shape, are arranged in parallel to form a stripe pattern. As shown in FIGS. 1C, 1D, the n+-type source region 4 on an outer edge of the n+-type SiC substrate 1, including a region around an end portion of the trench 6 in the longitudinal direction, is removed to form a mesa structure. Further, the n−-type channel layer 7 and the second gate region 8 at the end portion of the trench 6 are removed to form a recess shape. Therefore, the n+-type source region 4 remains only at a position adjacent to a long side of each trench 6 so that a JFET can be formed only at the position adjacent to the long side of each trench 6.

In the case of the SiC semiconductor device having such a structure, even if the n−-type channel layer 7 is thicker at the end portion of the trench 6 than at the long side portion of the trench 6, it is less likely that a JFET is formed at the end portion of the trench 6. Therefore, unlike the conventional structure in which the JFET is formed at the end portion of the trench 6, there is no effect caused by a deviation of a threshold of a JFET formed at the end portion of the trench 6 from a threshold of a JFET formed at the long side portion of the trench 6. Thus, the structure of the SiC semiconductor device according to the first embodiment can reduce an excessive drain current occurring when a gate voltage approaches a threshold.

It is preferable that the recess shape be formed by removing the n−-type channel layer 7 at the end portion of the trench 6 in such a manner that the n−-type channel layer 7 becomes thinner at the end portion of the trench 6 than at the long side portion of the trench 6 and by removing the n−-type channel layer 7 at the end portion of the trench 6 by a thickness greater than the thickness of the first gate region 3. In other words, it is preferable that the depth of the recess shape is greater than the thickness of the first gate region 3 to remove a thicker portion of the n−-type channel layer 7 at the end portion of the trench 6 than the n⁻-type channel layer 7 at the long side portion of the trench 6. In such an approach, the distance between the n⁻-type channel layer 7 at the end portion of the trench 6 and the n⁺-type source region 4 becomes greater than a channel length. Therefore, the drain current does not flow even when the gate voltage is close to the threshold. Thus, the excessive drain current can be prevented.

Figure 2:
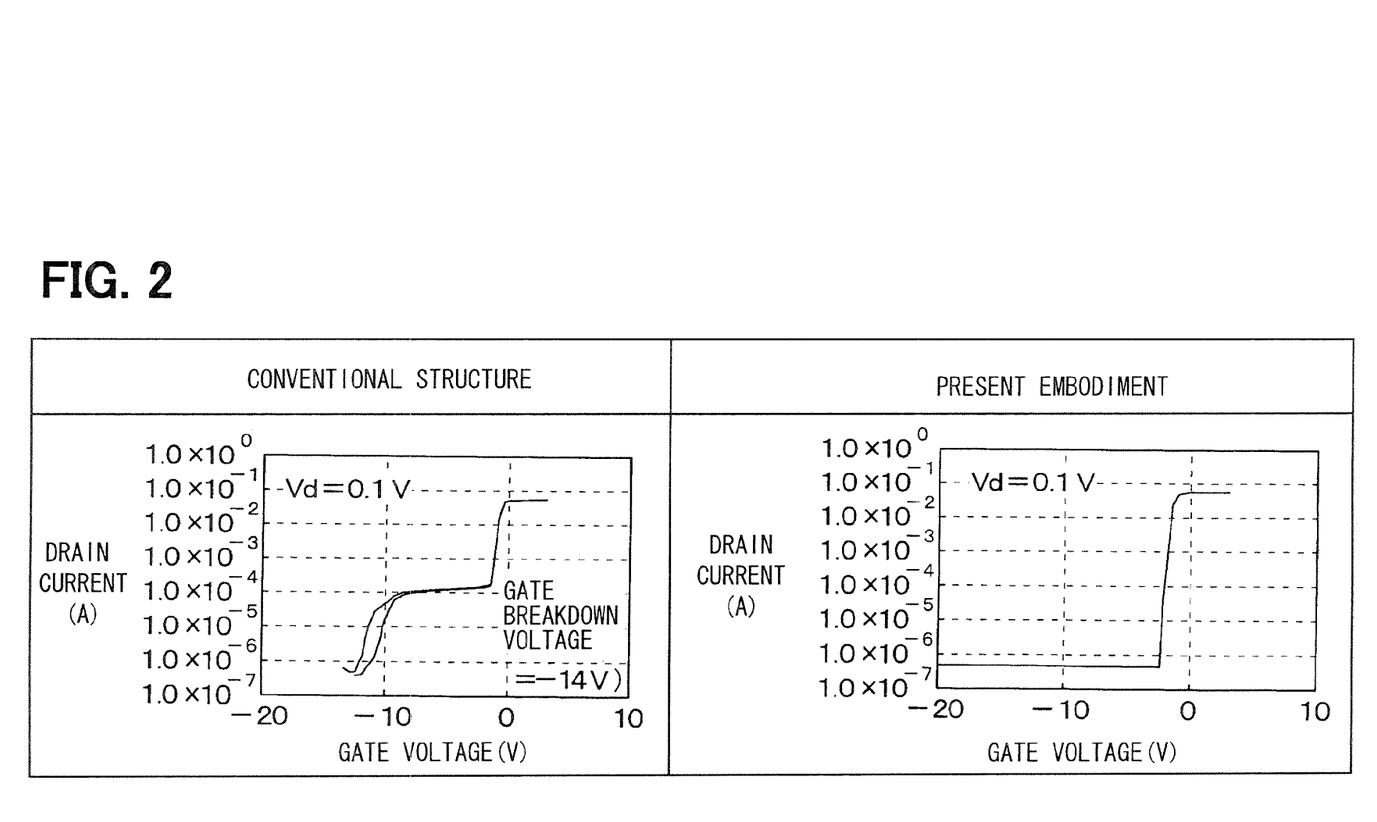
FIG. 2 is a diagram illustrating a result of a measurement of a characteristic of a drain current with respect to a gate voltage for a conventional structure and a structure according to the first embodiment.

FIG. 2 is a diagram illustrating a result of a measurement of a characteristic of a drain current (A) with respect to a gate voltage (V) for a conventional structure in which the n⁺-type source region 4 at the end portion of the trench 6 remains and for the recess shape structure of the present embodiment in which the n⁺-type source region 4 at the end portion of the trench 6 is removed. As can be seen from FIG. 2, unlike the conventional structure, the recess shape structure of the present embodiment prevents the drain current from flowing until the gate voltage reaches the threshold so that the drain current cannot flow even when the gate voltage approaches the threshold. The measurement result shown in FIG. 2 indicates that the structure of the SiC semiconductor device according to the present embodiment can reduce the excessive drain current occurring when the gate voltage approaches the threshold.

Figure 3A:
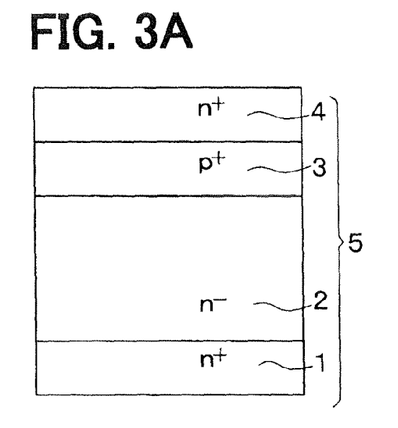
FIGS. 3A-3H are diagrams illustrating cross-sectional views of a method of manufacturing the SiC semiconductor device of FIGS. 1A-1D.
Figure 3B:
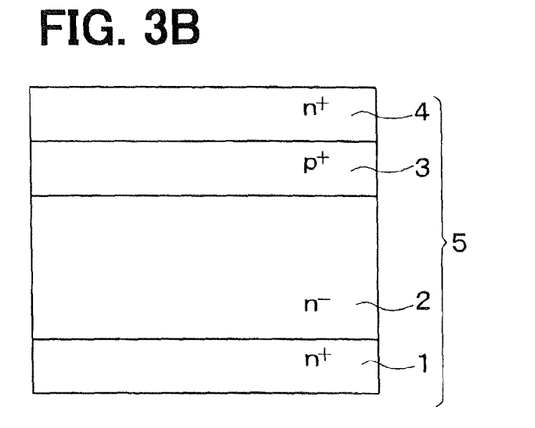
Figure 3C:
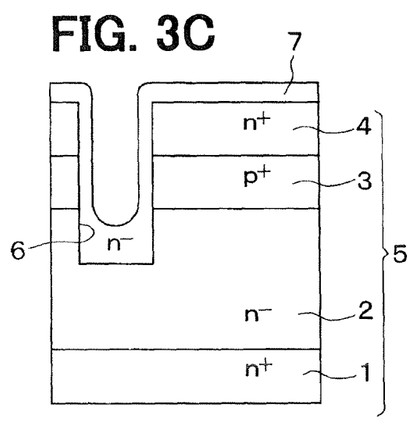
Figure 3D:
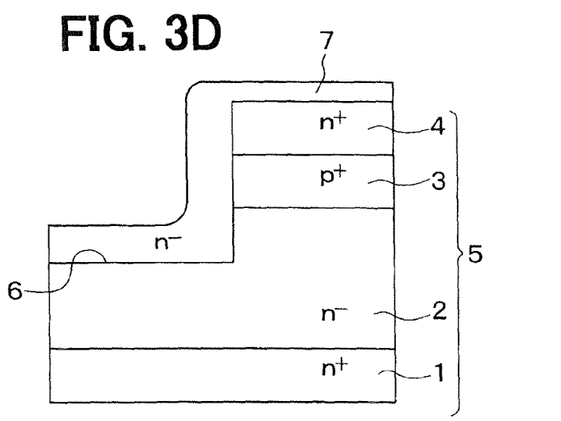
Figure 3E:
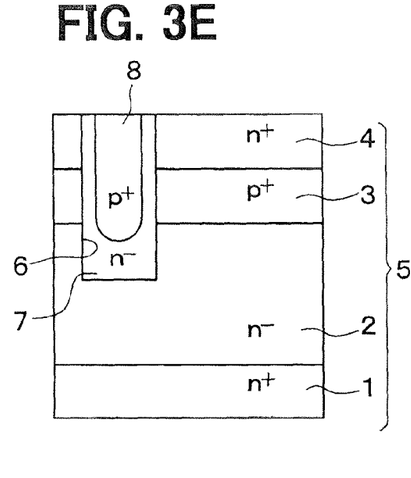
Figure 3F:
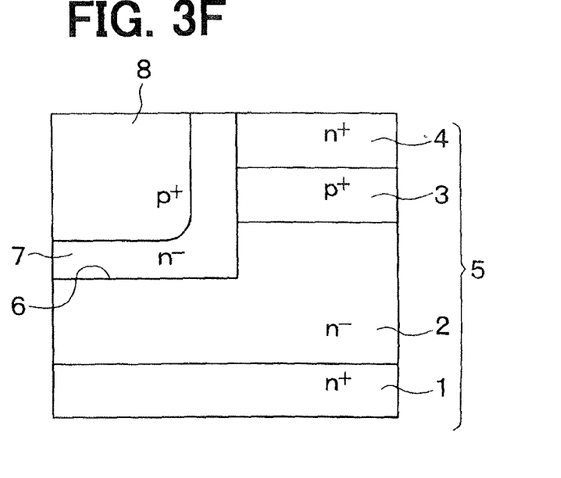
Figure 3G:
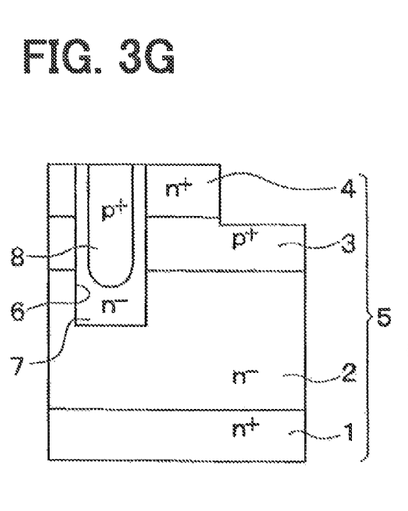
Figure 3H:
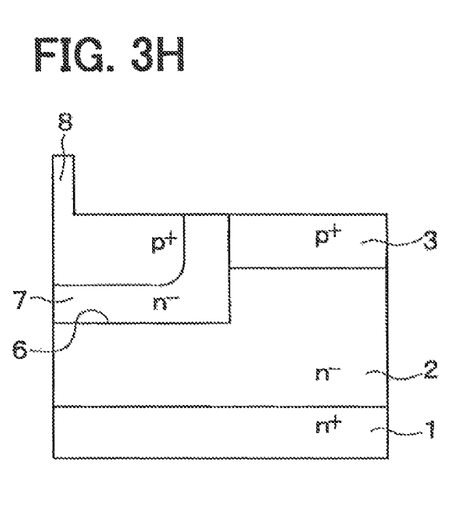

Next, a method of manufacturing the SiC semiconductor device according to the first embodiment is described below with reference to FIGS. 3A-3H. FIGS. 3A-3H are cross-sectional views illustrating the method of manufacturing the SiC semiconductor device. FIGS. 3A, 3C, 3E, and 3G correspond to FIG. 1B. FIGS. 3B, 3D, 3F, and 3H correspond to FIG. 1D. FIGS. 3A and 3B illustrate the same process. FIGS. 3C and 3D illustrate the same process. FIGS. 3E and 3F illustrate the same process. FIGS. 3G and 3H illustrate the same process.

Firstly, in a process shown in FIGS. 3A and 3B, the n⁻-type drift layer 2, the p⁺-type first gate region 3, and the n⁺-type source region 4 are epitaxially grown, in turn, on the surface of the n⁺-type SiC substrate 1 to form the semiconductor substrate 5.

Next, in a process shown in FIGS. 3C and 3D, after a mask having an opening corresponding to the trench 6 is placed on the semiconductor substrate 5, anisotropic etching such as reactive ion etching (RIE) is performed so that the trench 6 can be formed in the semiconductor substrate 5. Then, the n⁻-type channel layer 7 is formed on the semiconductor substrate 5, including the inside of the trench 6, by epitaxial growth. At this time, due to migration of the n⁻-type channel layer 7, the n⁻-type channel layer 7 becomes thicker at a bottom portion and the end portion of the trench 6 than at the long side portion of the trench 6.

Then, in a process shown in FIGS. 3E and 3F, after the p⁺-type second gate region 8 is formed on the surface of the n⁻-type channel layer 7, the second gate region 8 and the n⁻-type channel layer 7 are planarized by chemical mechanical polishing (CMP) or the like until the n⁺-type source region 4 is exposed. As a result, the second gate region 8 and the n⁻-type channel layer 7 can remain only in the trench 6.

Then, in a process shown in FIGS. 3G and 3H, the n⁺-type source region 4 on the outer edge of the semiconductor substrate 5 is removed to form a mesa structure. At the same time, the n⁺-type source region 4, the n⁻-type channel layer 7, and the second gate region 8 near the end portion of the trench 6 are partially removed to form a recess shape. Specifically, after a mask having an opening corresponding to the outer edge of the semiconductor substrate 5 and an opening corresponding to the n⁺-type source region 4, the n⁻-type channel layer 7, and the second gate region 8 to be partially removed is placed on the semiconductor substrate 5, an anisotropic etching such as RIE is performed so that parts corresponding to the openings of the mask are removed. Thus, in addition to the n⁺-type source region 4 on the outer edge of the semiconductor substrate 5, the n⁺-type source region 4, the n⁻-type channel layer 7, and the second gate region 8 at the end portion of the trench 6 are partially removed so that the recess shape can be formed. Then, although not shown in the drawings, a process of forming the gate electrode 9, a process of forming the interlayer dielectric layer 10, a process of forming the contact hole, a process of forming the source electrode 11, and a process of forming the drain electrode 12 are performed in a conventional manner so that the SiC semiconductor device shown in FIG. 1 can be manufactured.

Second Embodiment

A SiC semiconductor device according to a second embodiment of the present invention is described below with reference to FIGS. 4A-4C. The second embodiment prevents a JFET from being formed at the end portion of the trench 6 in a way different from that of the first embodiment. A difference between the first and second embodiments is as follows.

Figure 4A:
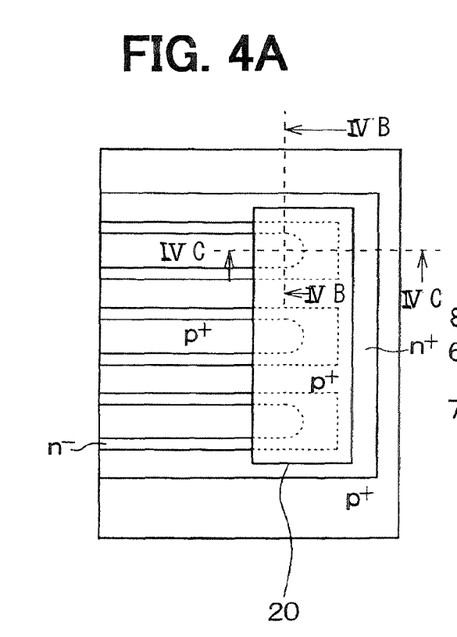
FIG. 4A is a diagram illustrating a plan view of a SiC semiconductor device according to a second embodiment of the present invention.
Figure 4B:
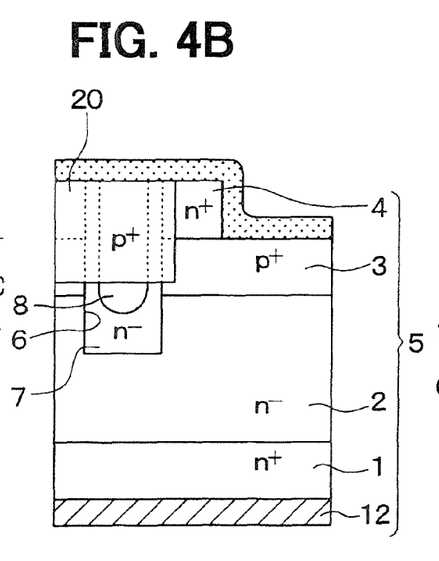
FIG. 4B is a diagram illustrating a cross-sectional view taken along the line IVB-IVB in FIG. 4A.
Figure 4C:
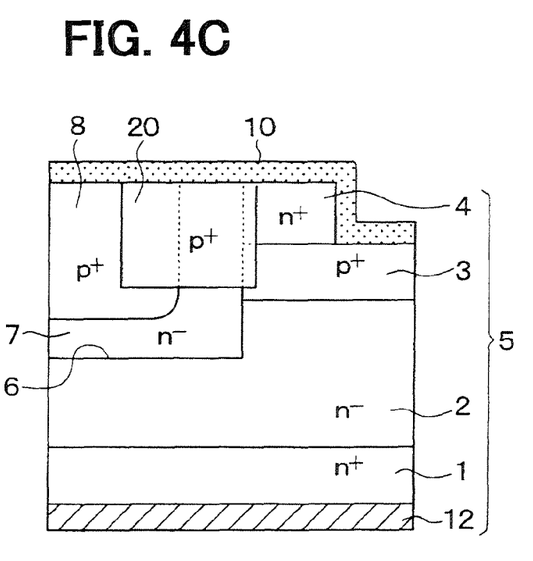
FIG. 4C is a diagram illustrating a cross-sectional view taken along the line IVC-IVC in FIG. 4A.

FIGS. 4A-4C are diagrams illustrating the SIC semiconductor device according to the second embodiment. FIG. 4A is a plan view of the SiC semiconductor device, FIG. 4B is a cross-sectional view taken along the line IVB-IVB in FIG. 4A, and FIG. 4C is a cross-sectional view taken along the line IVC-IVC in FIG. 4A.

As shown in FIGS. 4A-4C, according to the second embodiment, unlike the first embodiment in which the n⁺-type source region 4, the n⁻-type channel layer 7, and the second gate region 8 near the end portion of the trench 6 are partially removed, p-type impurities are ion-implanted into a region near the end portion of the trench 6 to form a p⁺-type region 20. Specifically, as shown in FIG. 4A, the p⁺-type region 20 is laid out to form a strip shape (rectangular shape) that completely covers the end portion of each trench 6. The p⁺-type region 20 is shallower than the first gate region 3 or the second gate region 8 and deeper than the n⁺-type source region 4. The n⁻-type channel layer 7 located between the n⁺-type source region 4 and the second gate region 8 at least at the end portion of the trench 6 is completely covered with the p⁺-type region 20 to prevent the JFET from being formed at the end portion of the trench 6.

As described above, according to the second embodiment, the region near the end portion of the trench 6 is completely covered with the p⁺-type region 20. Therefore, the JFET formed at the end portion of the trench 6 can be prevented so that the same advantage as the first embodiment can be obtained.

Figure 5A:
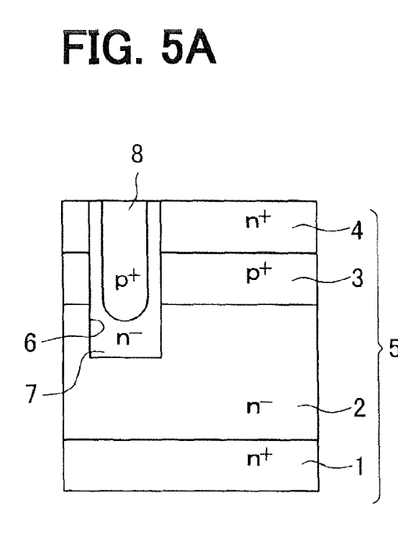
FIGS. 5A-5D are diagrams illustrating cross-sectional views of a method of manufacturing the SiC semiconductor device of FIGS. 4A-4C.
Figure 5B:
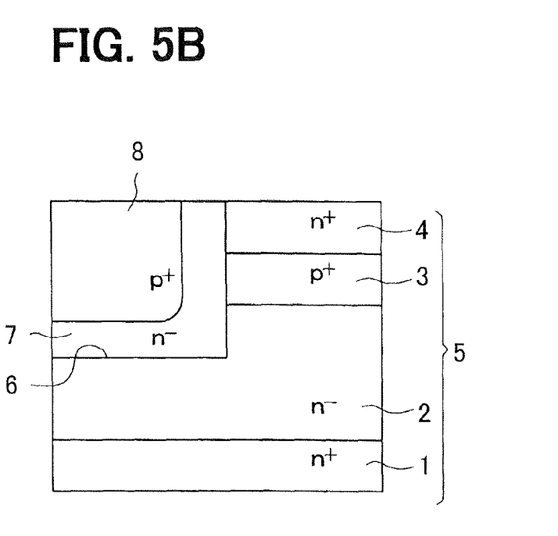
Figure 5C:
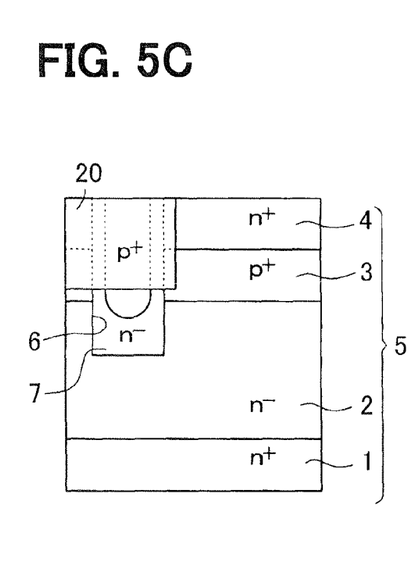
Figure 5D:
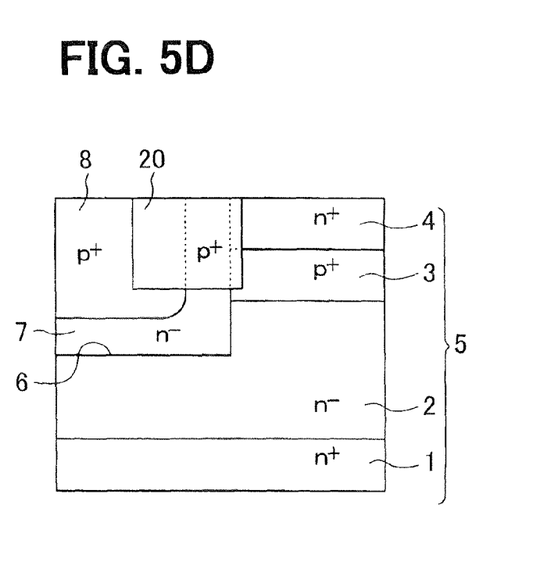

Next, a method of manufacturing the SiC semiconductor device according to the second embodiment is described below with reference to FIGS. 5A-5D. FIGS. 5A-5D are cross-sectional views illustrating the method of manufacturing the SIC semiconductor device. FIGS. 5A and 5C correspond to FIG. 1B. FIGS. 5B and 5D correspond to. FIG. 1D. FIGS. 5A and 5B illustrate the same process. FIGS. 5C and 5D illustrate the same process.

Firstly, the processes shown in FIGS. 3A-3F are performed so that the semiconductor substrate 5 having a structure shown in FIGS. 5A and 5B can be formed. Then, although not shown in the drawings, a mask, such as LTO, having an opening corresponding to the p⁺-type region 20 is placed on the semiconductor substrate 5. Then, p-type impurities are ion implanted into the region of the semiconductor substrate 5 near the end portion of the trench 6 by using the mask. Then, the implanted p-type impurities are activated by annealing treatment so that the structure shown in FIGS. 5C and 5D can be formed. Then, although not shown in the drawings, a process of forming a mesa structure by removing the n⁺-type source region 4 on the outer edge of the semiconductor substrate 5, a process of forming the gate electrode 9, a process of forming the interlayer dielectric layer 10, a process of forming the contact hole, and a process of forming the source electrode 11, and a process of forming the drain electrode 12 are performed in a conventional manner so that the SiC semiconductor device shown in FIGS. 4A-4C can be manufactured.

As described above, the method of manufacturing the SiC semiconductor device according to the second embodiment is basically the same as the method of manufacturing the SiC semiconductor device according to the first embodiment except that the process of forming the p⁺-type region 20 is performed and that the n⁺-type source region 4, the n⁻-type channel layer 7, and the second gate region 8 at the end portion of the trench 6 are not partially removed at the time of forming the mesa structure.

Third Embodiment

A SiC semiconductor device according to a third embodiment of the present invention is described below with reference to FIGS. 6A-6C. The third embodiment prevents a JFET from being formed at the end portion of the trench 6 in a way different from that of the first embodiment. A difference between the first and third embodiments is as follows.

Figure 6A:
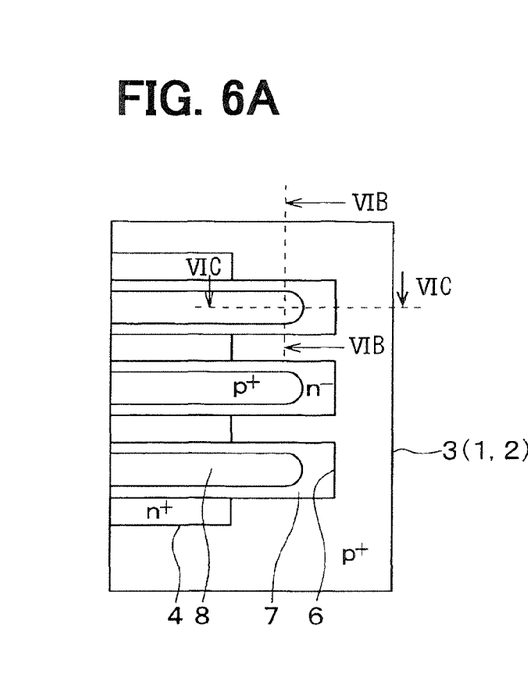
FIG. 6A is a diagram illustrating a plan view of a SiC semiconductor device according to a third embodiment of the present invention.
Figure 6B:
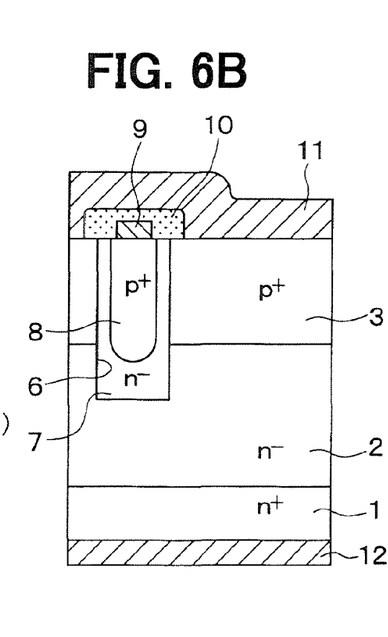
FIG. 6B is a diagram illustrating a cross-sectional view taken along the line VIB-VIB in FIG. 6A.
Figure 6C:
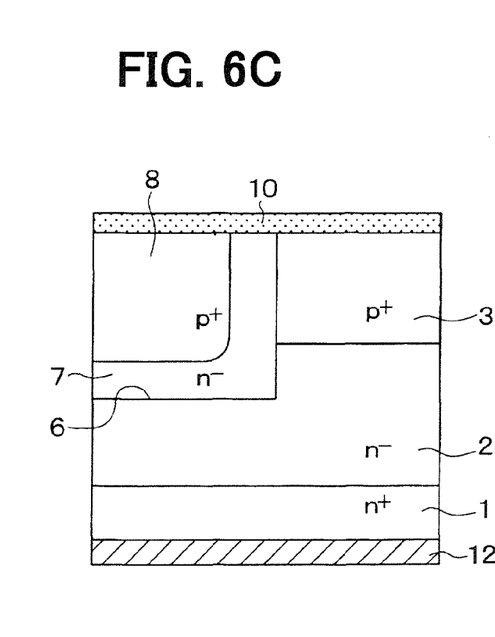
FIG. 6C is a diagram illustrating a cross-sectional view taken along the line VIC-VIC in FIG. 6A.

FIGS. 6A-6C are diagrams illustrating the SiC semiconductor device according to the third embodiment. FIG. 6A is a plan view of the SiC semiconductor device, FIG. 6B is a cross-sectional view taken along the line VIB-VIB in FIG. 6A, and FIG. 6C is a cross-sectional view taken along the line IVC-VIC in FIG. 6A.

As shown in FIGS. 6A-6C, according to the third embodiment, unlike the first embodiment in which the n⁺-type source region 4, the n⁻-type channel layer 7, and the second gate region 8 near the end portion of the trench 6 are partially removed, the n⁺-type source region 4 is formed by selective ion implantation in such a manner that the n⁺-type source region 4 is not formed in a region near the end portion of the trench 6. Specifically, as shown in FIG. 6A, n-type impurities are ion implanted into a region adjacent to the long side portion of each trench 6 so that the n⁺-type source region 4 can be formed at the long side portion of each trench 6. Further, as shown in FIGS. 6A-6C, the first gate region 3 is elongated to the level of the surface of the second gate region 8 near the end portion of the trench 6 to prevent the n⁺-type source region 4 from being formed at the end portion of the trench 6.

As described above, according to the third embodiment, the n⁺-type source region 4 is formed by selective ion implantation to prevent the n⁺-type source region 4 from being formed at the end portion of the trench 6. Therefore, the JFET formed at the end portion of the trench 6 can be prevented so that the same advantage as the first embodiment can be obtained.

The method of manufacturing the SiC semiconductor device according to the third embodiment is basically the same as the method of manufacturing the SiC semiconductor device according to the first embodiment except that the process of forming the n⁺-type source region 4 is performed by ion implantation.

(Modifications)

The embodiments described above can be modified in various ways, for example, as follows.

In the embodiments, the SiC semiconductor device has a JFET. Alternatively, the SiC semiconductor device can have a MOSFET by forming a gate insulation layer instead of the second gate region 8 on a surface of the n⁻-type channel layer 7 and by forming a gate electrode on a surface of the gate insulation layer. In such an approach, a MOSFET formed at the end portion of the trench 6 can be prevented so that the same advantage as the embodiments can be obtained.

A method of manufacturing the SiC semiconductor device having a MOSFET is basically the same as the method of manufacturing the SiC semiconductor device having a JFET except that a process of forming a gate insulation layer by thermal oxidation is performed after forming the n⁻-type channel layer 7, that a process of forming the gate electrode on the surface of the gate electrode is performed, and that a process of planarizing the gate electrode, the gate insulation layer, and the n⁻-type channel layer 7 are performed until a base region corresponding to the first gate region 3 is exposed.

In the first embodiment, the recess shape is formed over a relatively wide region near the end portion of the trench 6 is formed. In the second embodiment, the p⁺-type region 20 is formed over a relatively wide region near the end portion of the trench 6. It is noted that these are only examples. It does not matter how to form the recess shape, as long as the n⁺-type source region 4 is removed to prevent the JFET from being formed at the end portion of the trench 6. It does not matter how to form the p⁺-type region 20, as long as the n⁺-type source region 4 is inverted to p-type to prevent the JFET from being formed at the end portion of the trench 6. It is preferable that the recess shape be formed by completely removing a thicker portion of the n⁻-type channel layer 7 at the end portion of the trench 6 than the n⁻-type channel layer 7 at the long side portion of the trench 6. Likewise, it is preferable that the p⁺-type region 20 be formed to completely cover the thicker portion of the n⁻-type channel layer 7. In such an approach, even when the mask used to form the recess shape or the p⁺-type region 20 becomes misaligned, it is less likely that the JFET or the MOSFET is formed at the end portion of the trench 6.

In the embodiments, the JFET and the MOSFET are n-channel types in which a channel region is formed in the n⁻-type channel layer 7. Alternatively, the JFET and the MOSFET can be p-channel types.

In the embodiments, the n⁺-type source region 4 is formed by epitaxial growth. Alternatively, the n⁺-type source region 4 can be formed by ion implantation of n-type impurities into the first gate region 3.

In the embodiments, the trench 6 has a strip shape with a longitudinal direction. The strip shape is not limited to a rectangle. For example, the strip shape can be a parallelogram or a hexagon in which the center of the end portion of the trench 6 is sharpened (e.g., a shape formed by elongating two opposing sides of a regular hexagon).

Such changes and modifications are to be understood as being within the scope of the present invention as defined by the appended claims.

What is claimed is:

1. A silicon carbide semiconductor device having a JFET comprising:
   a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation;

a strip-shaped trench having a longitudinal direction and reaching the drift layer by penetrating the source region and the first gate region;

a first conductivity type channel layer formed on an inner wall of the trench by epitaxial growth; and a second conductivity type second gate region formed on the channel layer, wherein the source region is not formed at an end portion of the trench in the longitudinal direction.

2. The silicon carbide semiconductor device according to claim 1, wherein the end portion of the trench has a recess shape with a depth greater than a thickness of the source region to remove at least the source region at the end portion of the trench.

3. The silicon carbide semiconductor device according to claim 2, wherein the depth of the recess shape is greater than a thickness of the first gate region to remove a thicker portion of channel layer at the end portion of the trench than the channel layer at the long side portion of the trench.

4. The silicon carbide semiconductor device according to claim 2, wherein the trench comprises a plurality of trenches that are arranged parallel in a stripe pattern, and the end portion of the plurality of trenches is continuously removed to form the recess shape.

5. A silicon carbide semiconductor device having a MOSFET comprising:

a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation;

a strip-shaped trench having a longitudinal direction and reaching the drift layer by penetrating the source region and the base layer;

a first conductivity type channel layer formed on an inner wall of the trench by epitaxial growth;

a gate insulation layer formed on the channel layer; and a gate electrode formed on a surface of the gate insulation layer in the trench, wherein the source region is not formed at an end portion of the trench in the longitudinal direction.

6. A silicon carbide semiconductor device having a JFET comprising:

a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by ion implantation;

a strip-shaped trench having a longitudinal direction and reaching the drift layer by penetrating the source region and the first gate region;

a first conductivity type channel layer formed on an inner wall of the trench by epitaxial growth; and a second conductivity type second gate region formed on the channel layer, wherein the source region is formed at a long side portion of the trench and is not formed at an end portion of the trench in the longitudinal direction.

7. A silicon carbide semiconductor device having a MOSFET comprising:

a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation;

a strip-shaped trench having a longitudinal direction and reaching the drift layer by penetrating the source region and the base layer;

a first conductivity type channel layer formed on an inner wall of the trench by epitaxial growth;

a gate insulation layer formed on the channel layer; and a gate electrode formed on a surface of the gate insulation layer in the trench, wherein the source region is formed at a long side portion of the trench and is not formed at an end portion of the trench in the longitudinal direction.

8. A method of manufacturing a silicon carbide semiconductor device having a JFET comprising:

preparing a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation;

forming a strip-shaped trench having a longitudinal direction and reaching the drift layer by penetrating the source region and the first gate region;

forming a first conductivity type channel layer on an inner wall of the trench by epitaxial growth;

forming a second conductivity type second gate region on the channel layer;

planarizing the channel layer and the second gate region until the source region is exposed; and removing the source region, the channel layer, and the second gate region at least at an end portion of the trench in the longitudinal direction by performing selective etching after the planarizing so that the end portion of the trench has a recess shape with a depth greater than a thickness of the source region.

9. The method according to claim 8, wherein the removing includes removing a thicker portion of channel layer at the end portion of the trench than the channel layer at a long side portion of the trench.

10. The method according to claim 9, wherein the forming the trench includes arranging a plurality of trenches in parallel to form a stripe pattern, and the removing includes continuously removing the end portion of the plurality of trenches to form the recess shape.

11. A method of manufacturing a silicon carbide semiconductor device having a MOSFET comprising:

preparing a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation;

forming a strip-shaped trench having a longitudinal direction and reaching the drift layer by penetrating the source region and the base layer;

forming a first conductivity type channel layer on an inner wall of the trench by epitaxial growth;

forming a gate insulation layer on the channel layer; and forming a gate electrode on a surface of the gate insulation layer in the trench;

planarizing the gate electrode, the gate insulation layer, and the channel layer until the source region is exposed; and removing the source region, the channel layer, and the second gate region at least at an end portion of the trench in the longitudinal direction by performing selective etching after the planarizing so that the end portion of the trench has a recess shape with a depth greater than a thickness of the source region.

12. A method of manufacturing a silicon carbide semiconductor device having a JFET comprising:

preparing a semiconductor substrate including a first conductivity type silicon carbide substrate, a first conductivity type drift layer formed on the first conductivity type silicon carbide substrate by epitaxial growth, a second conductivity type first gate region formed on the drift layer by epitaxial growth, and a first conductivity type source region formed on the first gate region by epitaxial growth or ion implantation;

forming a strip-shaped trench having a longitudinal direction and reaching the drift layer by penetrating the source region and the first gate region;

forming a first conductivity type channel layer on an inner wall of the trench by epitaxial growth; and forming a second conductivity type second gate region on the channel layer, wherein the preparing the semiconductor substrate includes forming the source region on the first gate region by ion implantation in such a manner that the source region is formed at a long side portion of the trench and is not formed at an end portion of the trench in the longitudinal direction.

13. The method according to claim 12, wherein the preparing the semiconductor substrate includes forming the source region by ion implantation in such a manner that the source region is not formed at a deeper portion of the channel layer at the end portion of the trench than the channel layer at the long side portion of the trench.

14. A method of manufacturing a silicon carbide semiconductor device having a MOSFET comprising:

preparing a semiconductor substrate including a first conductivity type silicon carbide substrate, a first conductivity type drift layer formed on the first conductivity type silicon carbide substrate by epitaxial growth, a second conductivity type base layer formed on the drift layer by epitaxial growth, and a first conductivity type source region formed on the base layer by epitaxial growth or ion implantation;

forming a strip-shaped trench having a longitudinal direction and reaching the drift layer by penetrating the source region and the base layer;

forming a first conductivity type channel layer on an inner wall of the trench by epitaxial growth;

forming a gate insulation layer on the channel layer; and forming a gate electrode on a surface of the gate insulation layer in the trench, wherein the preparing the semiconductor substrate includes forming the source region on the base layer by ion implantation in such a manner that the source region is formed at a long side portion of the trench and is not formed at an end portion of the trench in the longitudinal direction.

* * * * *